(12) United States Patent
Neugirg et al.

(10) Patent No.: US 12,224,222 B2
(45) Date of Patent: Feb. 11, 2025

(54) SEMICONDUCTOR PACKAGE HAVING A THERMALLY AND ELECTRICALLY CONDUCTIVE SPACER

(71) Applicant: Infineon Technologies AG, Neubiberg (DE)

(72) Inventors: Christian Neugirg, Regensburg (DE); Adrian Lis, Regensburg (DE); Peter Scherl, Regensburg (DE); Ewald Guenther, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 379 days.

(21) Appl. No.: 17/572,858

(22) Filed: Jan. 11, 2022

(65) Prior Publication Data

US 2023/0223312 A1    Jul. 13, 2023

(51) Int. Cl.
| | |
|---|---|
| *H01L 23/367* | (2006.01) |
| *H01L 23/00* | (2006.01) |
| *H01L 23/31* | (2006.01) |
| *H01L 23/498* | (2006.01) |

(52) U.S. Cl.
CPC ........ *H01L 23/367* (2013.01); *H01L 23/3121* (2013.01); *H01L 23/3171* (2013.01); *H01L 23/49844* (2013.01); *H01L 24/04* (2013.01); *H01L 24/48* (2013.01); *H01L 2224/04042* (2013.01); *H01L 2224/48177* (2013.01)

(58) Field of Classification Search
CPC ............... H01L 23/367; H01L 23/3121; H01L 23/3171; H01L 23/49844; H01L 24/04; H01L 24/48; H01L 2224/04042; H01L 2224/48177
See application file for complete search history.

(56) References Cited

U.S. PATENT DOCUMENTS

| | | | | |
|---|---|---|---|---|
| 6,306,680 | B1 * | 10/2001 | Fillion | H01L 24/96 |
| | | | | 257/E23.125 |
| 9,337,163 | B2 * | 5/2016 | Delgado | H01L 24/19 |
| 9,406,658 | B2 * | 8/2016 | Lee | H01L 23/5389 |
| 10,002,821 | B1 * | 6/2018 | Hoegerl | H01L 23/051 |
| 10,211,133 | B2 * | 2/2019 | Grassmann | H01L 23/3735 |
| 10,403,601 | B2 | 9/2019 | Im et al. | |
| 10,804,115 | B2 * | 10/2020 | Kapusta | H01L 21/485 |
| 2009/0160046 | A1 * | 6/2009 | Otremba | H01L 24/82 |
| | | | | 257/700 |

(Continued)

*Primary Examiner* — Eugene Lee
(74) *Attorney, Agent, or Firm* — Murphy, Bilak & Homiller, PLLC

(57) ABSTRACT

A semiconductor package includes: a first substrate having a first metallized side; a semiconductor die attached to the first metallized side of the first substrate at a first side of the die, a second side of the die opposite the first side being covered by a passivation, the passivation having a first opening that exposes at least part of a first pad at the second side of the die; a thermally and electrically conductive spacer attached to the part of the first pad that is exposed by the first opening in the passivation, the spacer at least partly overhanging the passivation along at least one side face of the semiconductor die; a second substrate having a first metallized side attached to the spacer at an opposite side of the spacer as the semiconductor die; and an encapsulant encapsulating the semiconductor die and the spacer. Additional spacer embodiments are described.

25 Claims, 11 Drawing Sheets

(56) References Cited

U.S. PATENT DOCUMENTS

| | | | | |
|---|---|---|---|---|
| 2011/0079905 A1* | 4/2011 | Sanchez | ............. | H01L 25/0657 |
| | | | | 257/737 |
| 2014/0084457 A1* | 3/2014 | Cho | ........................ | H01L 24/14 |
| | | | | 257/737 |
| 2016/0126157 A1* | 5/2016 | Jeon | ........................ | H01L 25/18 |
| | | | | 257/693 |
| 2023/0238307 A1* | 7/2023 | Liu | ..................... | H01L 23/4334 |
| | | | | 257/741 |

* cited by examiner

SEMICONDUCTOR PACKAGE HAVING A THERMALLY AND ELECTRICALLY CONDUCTIVE SPACER

BACKGROUND

For dual side cooling modules, a stack of electrically conductive spacers and power semiconductor dies (chips) are soldered between two substrates. The distance between the respective outer surfaces of the two substrates must be maintained within a narrow tolerance (e.g., <0.1 mm) to fit into the surrounding cooler structure. Since the thickness tolerances of the stacked elements (substrates, dies, spacers, etc.) exceeds 0.1 mm, the solder joints used to attach the elements to one another must accommodate individual thickness variations to keep the distance of the outer substrate surfaces constant. Thus, the solder joints are relatively thick (e.g., several 100 μm) which leads to excessive solder protruding onto parts of the die surfaces. Since the top passivation layer of a power semiconductor die typically has poor solder wetting behavior, excessive solder material forms a solid flake above the die passivation. Subsequently, the cavity between the two substrates is filled with a polymeric encapsulant material. During environmental stress such as power cycling and temperature cycling, the encapsulant acts mechanically on the solder flake, causing macroscopic migration (solder extrusion) which can lead to electrical shorts, since the solder flake may come into electrical contact with parts of the die that have different electrical potentials.

In addition to the issues discussed above, the thermal resistance of a power semiconductor package should be low as possible to ensure adequate thermal performance. However, since the package encapsulant (typically mold compound) and the spacers used in power semiconductor packages are made of different materials, the spacer tends to heat up more quickly than the surrounding mold compound such that spacer expands whereas the mold compound does not. The spacer expansion creates a tensile force in z direction which can lead to cracking of the die passivation.

Hence, there is a need form an improved power semiconductor module design that avoids the problems of solder flake formation and related migration during module operation and also cracking of the die passivation.

SUMMARY

According to an embodiment of a semiconductor package, the semiconductor package comprises: a first substrate having a first metallized side; a semiconductor die attached to the first metallized side of the first substrate at a first side of the semiconductor die, a second side of the semiconductor die opposite the first side being covered by a passivation, the passivation having a first opening that exposes at least part of a first pad at the second side of the semiconductor die; a thermally and electrically conductive spacer attached to the part of the first pad that is exposed by the first opening in the passivation, the spacer at least partly overhanging the passivation along at least one side face of the semiconductor die; a second substrate having a first metallized side attached to the spacer at an opposite side of the spacer as the semiconductor die; and an encapsulant encapsulating the semiconductor die and the spacer.

According to another embodiment of a semiconductor package, the semiconductor package comprises: a first substrate having a first metallized side; a solder joint between the first metallized side of the first substrate and a semiconductor die at a first side of the semiconductor die, a second side of the semiconductor die opposite the first side being covered by a passivation, the passivation having an opening that exposes at least part of a pad at the second side of the semiconductor die; a thermally and electrically conductive spacer attached to the part of the pad that is exposed by the opening in the passivation, the spacer having a plurality of sidewalls each of which is plated at least in a region where the solder joint extends onto the sidewalls of the spacer; a second substrate having a first metallized side attached to the spacer at an opposite side of the spacer as the semiconductor die; and an encapsulant encapsulating the semiconductor die and the spacer.

According to an embodiment of a method of producing a semiconductor package, the method comprises: attaching a semiconductor die to a first metallized side of a first substrate at a first side of the semiconductor die, a second side of the semiconductor die opposite the first side being covered by a passivation, the passivation having a first opening that exposes at least part of a first pad at the second side of the semiconductor die; attaching a thermally and electrically conductive spacer to the part of the first pad that is exposed by the first opening in the passivation, the spacer at least partly overhanging the passivation along at least one side face of the semiconductor die; attaching a first metallized side of a second substrate to the spacer at an opposite side of the spacer as the semiconductor die; and encapsulating the semiconductor die and the spacer in an encapsulant.

According to another embodiment of a method of producing a semiconductor package, the method comprises: forming a solder joint between a first metallized side of a first substrate and a semiconductor die at a first side of the semiconductor die, a second side of the semiconductor die opposite the first side being covered by a passivation, the passivation having an opening that exposes at least part of a pad at the second side of the semiconductor die; attaching a thermally and electrically conductive spacer to the part of the pad that is exposed by the opening in the passivation, the spacer having a plurality of sidewalls each of which is plated at least in a region where the solder joint extends onto the sidewalls of the spacer; attaching a first metallized side of a second substrate to the spacer at an opposite side of the spacer as the semiconductor die; and encapsulating the semiconductor die and the spacer in an encapsulant.

According to an embodiment of a method of producing a plurality of individual thermally and electrically conductive spacers for use in semiconductor packages, the method comprises: singulating a spacer panel into the plurality of individual thermally and electrically conductive spacers; and plating, at least partially, each sidewall of the individual spacers before, within or after singulating the spacer panel.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor package that is less susceptible to cracking of the die passivation. The power semiconductor package also may have good solder wetting behavior at the spacer sidewall such that excessive solder does not migrate onto unintended areas of the die (chip) surface. Also described herein are methods of producing such power semiconductor packages, and spacer embodiments that reduce the likelihood of die passivation cracking and yield good solder wetting behavior and related methods of producing such spacers from a spacer panel.

Described next, with reference to the figures, are exemplary embodiments of the spacer features, power semiconductor modules that utilize the spacer features, and methods of producing such power semiconductor modules and spacers. Any of the spacer feature embodiments and power semiconductor module embodiments described herein may be used interchangeably unless otherwise expressly stated.

Figure 1:
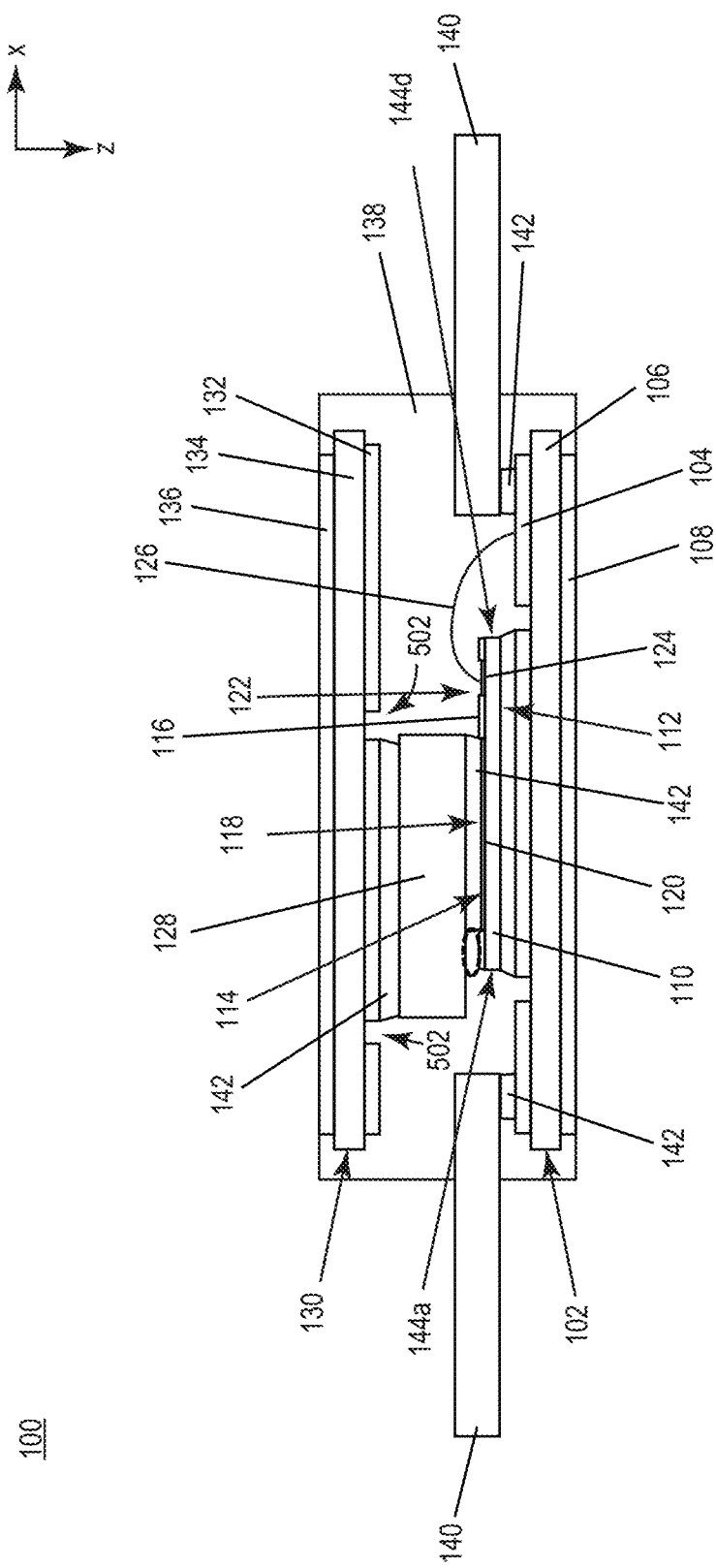
FIG. 1 illustrates a cross-sectional view of an embodiment of a semiconductor package having a spacer.

FIG. 1 illustrates a cross-sectional view of an embodiment of a semiconductor package 100. The semiconductor package 100 may form part of a power semiconductor module for use in various power applications such as in a DC/AC inverter, a DC/DC converter, an AC/DC converter, a DC/AC converter, an AC/AC converter, or the like.

The semiconductor package 100 includes a first substrate 102 having a first metallized side 104. The first substrate 102 may be, e.g., a DCB (direct copper bonded) substrate, an AMB (active metal brazed) substrate, an IMS (insulated metal substrate), etc. For example, the first metallized side 104 may be a patterned metallization formed on an electrically insulative body 106 such as a ceramic and having metallization sections that are separated from one another to accommodate different electric potentials and/or different node connections. The first substrate 102 may have a second metallized side 108 at the opposite side of the electrically insulative body 106 as the first metallized side 104. The second metallized side 108 may or may not be patterned.

The semiconductor package 100 also includes a semiconductor die 110 attached to the first metallized side 104 of the first substrate 102 at a first side 112 of the semiconductor die 110. The semiconductor die 110 may comprise, e.g., Si, silicon carbide (SiC), germanium (Ge), silicon germanium (SiGe), gallium nitride (GaN), gallium arsenide (GaAs), etc. A second side 114 of the semiconductor die 110 opposite the first side 112 is covered by a passivation 116 such as a polyimide or imide polymer. The passivation 116 may be a single layer, e.g., of silicon nitride or a multi-layer structure. For example, the passivation 116 may include a first silicon nitride layer, USG (undoped silicon glass) on the silicon nitride layer, and a second silicon nitride layer on the USG. A further barrier layer such as imide may be on the second silicon nitride layer. In other examples, the imide and/or USG and/or one of the silicon nitride layers may be omitted and/or a different stack of layers may be used. In general, the passivation 116 renders the semiconductor die 110 less readily affected or corroded by the environment. The passivation 116 has a first opening 118 that exposes at least part of a first pad 120 at the second side 114 of the semiconductor die 110.

In one embodiment, the semiconductor die 110 is a power diode die, a power transistor die such as a power MOSFET (metal-oxide-semiconductor field-effect transistor) die, a HEMT (high-electron mobility transistor) die, an IGBT (insulated-gate bipolar transistor) die, a JFET (junction filed-effect transistor) die, etc. According to this embodiment, the first pad 120 of the semiconductor die 110 is a source or emitter pad and the passivation 116 has a second opening 122 that exposes at least part of a gate pad 124 at the second side 114 of the semiconductor die 110. One or more wire bonds 126 may extend from the gate pad 124 to the first metallized side 104 of the first substrate 102 to provide a gate electrical connection to the die 110.

In the case of a power transistor device, the semiconductor die 110 may be a vertical power transistor die. For a vertical power transistor die, the primary current flow path is between the first and second sides 112, 114 of the semiconductor die 110 and the first side 112 of the die 110 includes a drain or collector terminal attached to the first metallized side 104 of the first substrate 102. The drain or collector terminal may be formed by metallizing the first side 112 of the semiconductor die 110. The semiconductor die 110 instead may be a lateral power transistor die where the primary current flow path is along one of the sides 112, 114 of the die 110. Other types of dies may be used in the semiconductor package 100, such as power diode dies, logic dies, controller dies, gate driver dies, etc.

The semiconductor package 100 also includes a thermally and electrically conductive spacer 128 attached to the part of the first pad 120 and that is exposed by the first opening 118 in the passivation 116. The spacer 128 may comprise a metal matrix composite material such as AlSiC which is an aluminum matrix with silicon carbide particles and where AlSiC exhibits very poor solder wetting. Other thermally and electrically conductive materials may be used for the spacer 128.

The primary function of the spacer 128 is to provide ensure a minimum clearance between the first substrate 102 and a second substrate 130 included in the semiconductor package 100. Since the semiconductor die 110 may be relatively thin, e.g., less than 100 μm thick, the spacer 128 ensures adequate clearance between the first and second substrates 102, 130. The spacer 128 is thermally conductive so as to dissipate heat from the second side 114 of the semiconductor die 110 to the second substrate 130. The spacer 128 is electrically conductive so as to provide an electrical connection between the first die pad 120 at the second side 114 of the semiconductor die 110 and a first metallized side 132 of the second substrate 130. The first metallized side 132 of the second substrate 130 is attached to the spacer 128 at an opposite side of the spacer 128 as the semiconductor die 110.

The second substrate 130 may have the same or similar construction as the first substrate 102. For example, the second substrate 130 may be a DCB substrate, an AMB substrate, an IMS, etc. The first metallized side 132 of the second substrate 130 may be a patterned metallization formed on an electrically insulative body 134 such as a ceramic and having metallization sections that are separated from one another to accommodate different electric potentials and/or different node connections. The second substrate 130 may have a second metallized side 136 at the opposite side of the electrically insulative body 134 as the first metallized side 132 that may or may not be patterned. In general, the first and second substrates 102, 130 may be the same or different type of substrate.

The semiconductor package 100 also includes an encapsulant 138 such as a mold compound encapsulating the semiconductor die 110 and the spacer 128. The encapsulant 138 may be formed, e.g., by a molding process such as injection molding, transfer molding, compression molding, etc. Leads 140 attached to the first metallized side 104 of the first substrate 102 may protrude through the encapsulant 138 to provide points of external electrical connection to the encapsulated semiconductor die 110. Solder joints 142 may be used to attach various components included in the semiconductor package 100.

According to the embodiment illustrated in FIG. 1, the spacer 128 at least partly overhangs the passivation 116 along at least one side face 144a of the semiconductor die 110. That is, the spacer 128 at least partly overhangs the passivation 116 in a line matching the length or direction of at least one side face 144a of the semiconductor die 110. Accordingly, the spacer 128 limits the volume of the encapsulant 138 above the passivation 116 along at least one side face 144a of the semiconductor die 110 as indicated by the dashed oval in FIG. 1. If expansion of the spacer 128 due to heating creates a tensile force in the height (z) direction of the package 100, the passivation 116 is much less prone to crack in each region where the volume of the encapsulant 138 above the passivation 116 has been reduced by the overhang of the spacer 128.

Figure 2:
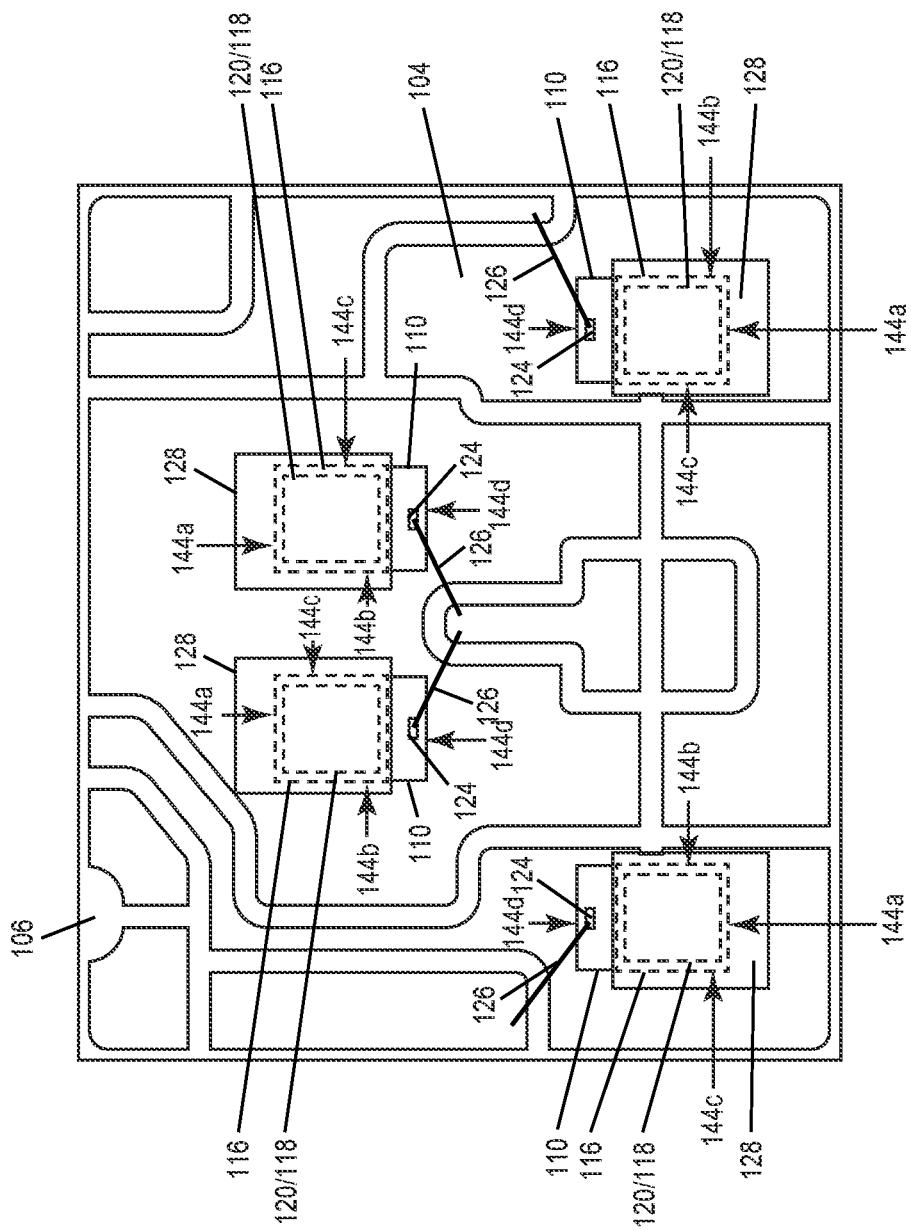
FIG. 2 shows a top-down plan view of the semiconductor package of FIG. 1 prior to attachment of a second substrate and encapsulation.

FIG. 2 shows a top-down plan view of the semiconductor package 100 prior to both attachment of the second substrate 130 and encapsulation. As shown in FIG. 2, the semiconductor package 100 may include more than one semiconductor die 110 and the first metallized side 104 of the first substrate 102 may be patterned to facilitate different electric potentials and/or different node connections. Additional components such as one or more passive components also may be attached to the first metallized side 104 of the first substrate 102.

According to the embodiment illustrated in FIG. 2, each semiconductor die 110 has four side faces 144a, 144b, 144c, 144d and the spacer 128 at least partly overhangs the passivation 116 along each side face 144a, 144b, 144c of the corresponding semiconductor die 110 except for the side face 144d of the die 110 over which the one or more wire bonds extend 126 so as to not interfere with the connection to the die gate pad 124. As shown in FIG. 2, the spacer 128 may overhang each side face 144a, 144b, 144c of the corresponding semiconductor die 110 except for the side face 144d over which the one or more wire bonds 126 extend. Accordingly, the volume of the encapsulant 138 above the passivation 116 is reduced by the spacer overhang along at least three side faces 144a, 144b, 144c of the corresponding semiconductor die 110. The die passivation 116 is much less prone to cracking in the regions of spacer overhang.

Figure 3:
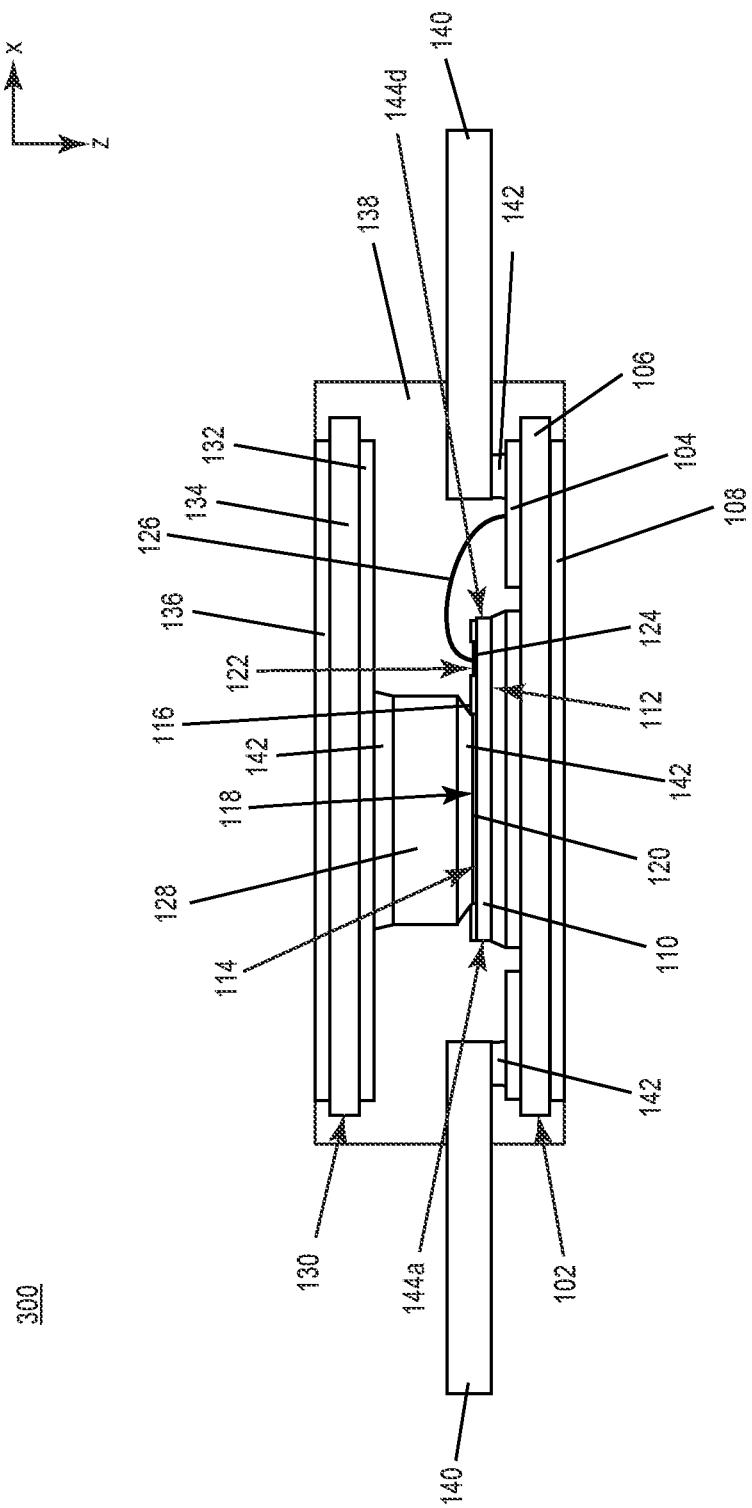
FIG. 3 illustrates a cross-sectional view of another embodiment of a semiconductor package having a spacer.
Figure 4:
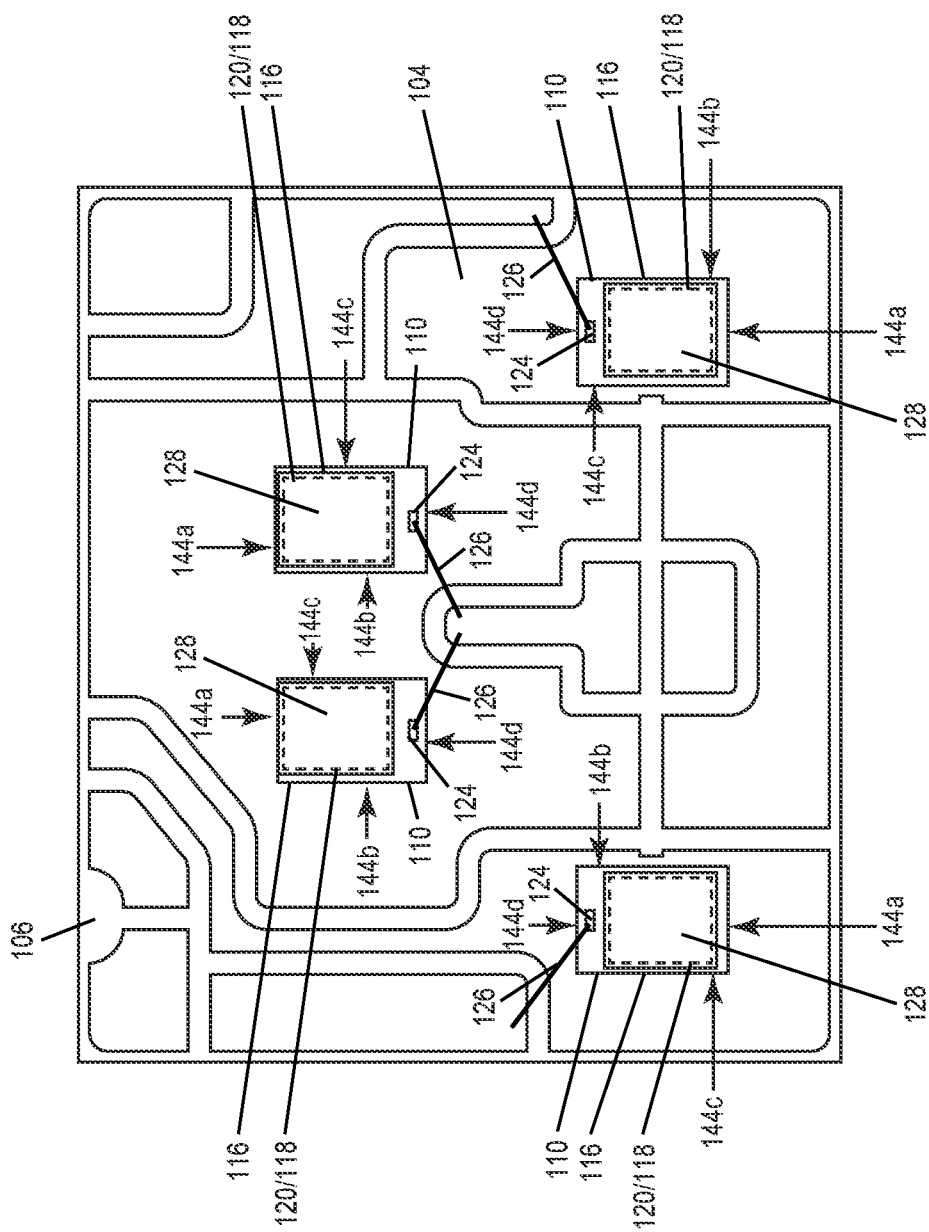
FIG. 4 shows a top-down plan view of the semiconductor package of FIG. 3 prior to attachment of a second substrate and encapsulation.

FIG. 3 illustrates a cross-sectional view of another embodiment of a semiconductor package 300. The embodiment shown in FIG. 3 is similar to the embodiment shown in FIG. 1. FIG. 4 shows a corresponding top-down plan view of the semiconductor package 300 of FIG. 3 prior to both attachment of the second substrate 130 and encapsulation.

In FIGS. 3 and 4, the spacer 128 at least partly overhangs the passivation 116 along each side face 144a, 114b, 144c, 144d of the semiconductor die 110 including the die side face 144d over which the one or more wire bonds 126 extend. However, the spacer 128 does not overhang the die side face 144d over which the one or more wire bonds 126 extend so as to not interfere with the connection to the die gate pad 124. The spacer 128 may not overhang any of the die side faces 144a, 144b, 144c, 144d as shown in FIG. 4, or may overhang one or more of the die side faces 114a, 144b, 144c except for the die side face 144d over which the one or more wire bonds 126 extend.

Figure 5:
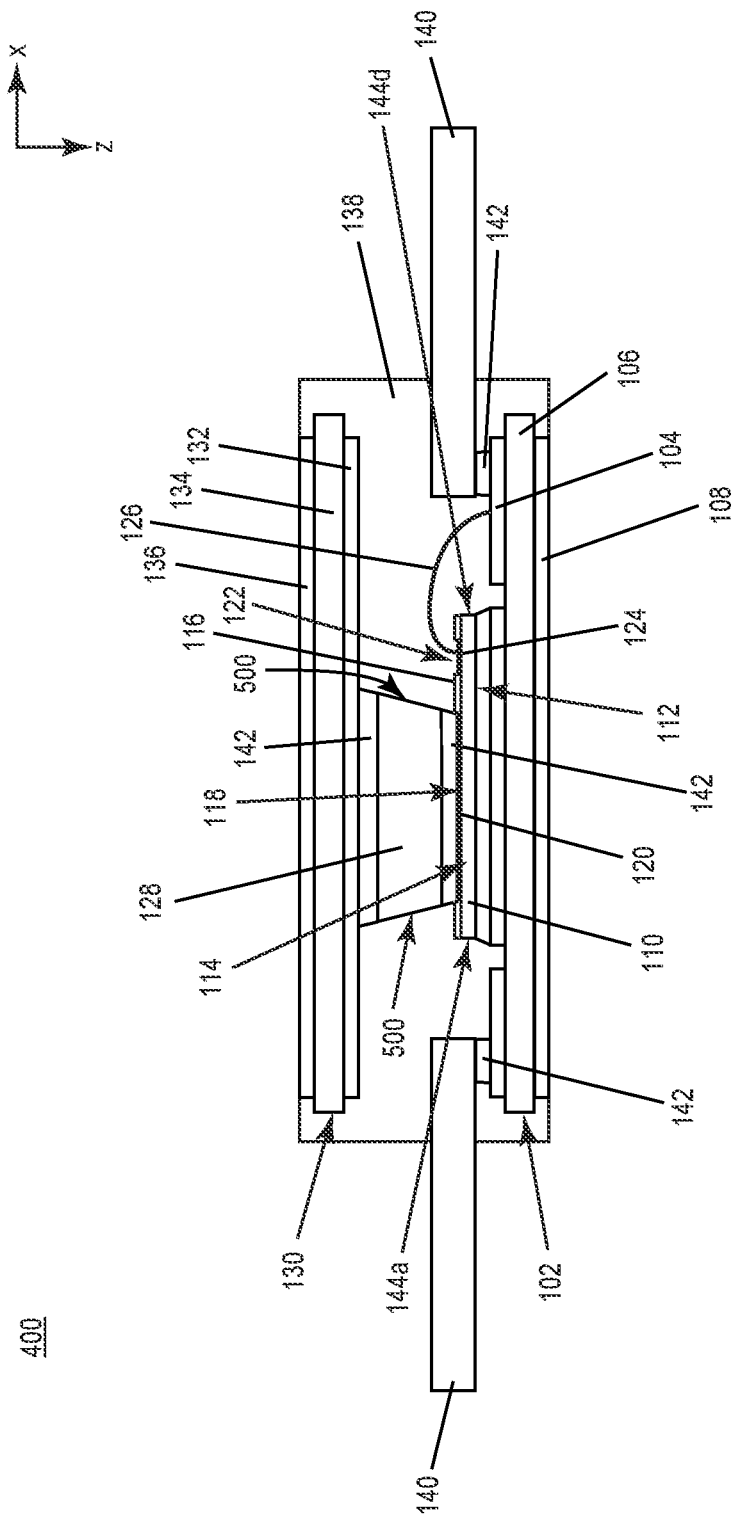
FIG. 5 illustrates a cross-sectional view of another embodiment of a semiconductor package having a spacer.

FIG. 5 illustrates a cross-sectional view of another embodiment of a semiconductor package 400. The embodiment shown in FIG. 5 is similar to the embodiments shown in FIGS. 1 through 4. In FIG. 5, the sidewalls 500 of the spacer 128 taper in a direction of the semiconductor die 110. That is, the spacer 128 becomes progressively smaller/narrower toward the end of the spacer 128 attached to the semiconductor die 110. The tapered sidewalls 500 of the spacer 128 provide for a gradual reduction in the amount of encapsulant 138 above the passivation 116 in the vertical (z) direction heading from the semiconductor die 110 to the second substrate 130.

As shown in FIGS. 3 and 5, the first metallized side 132 of the second substrate 130 may be contiguous and devoid of solder stop holes. In FIG. 1, the first metallized side 132 of the second substrate 130 has solder stop holes 502. The solder stop holes 502 contain solder wetting to defined regions of the first metallized side 132 of the second substrate 130. If the solder imparts a sufficient self-centering effect on the spacer 128, the solder stop holes 502 may be omitted as shown in FIGS. 3 and 5.

Figure 6:
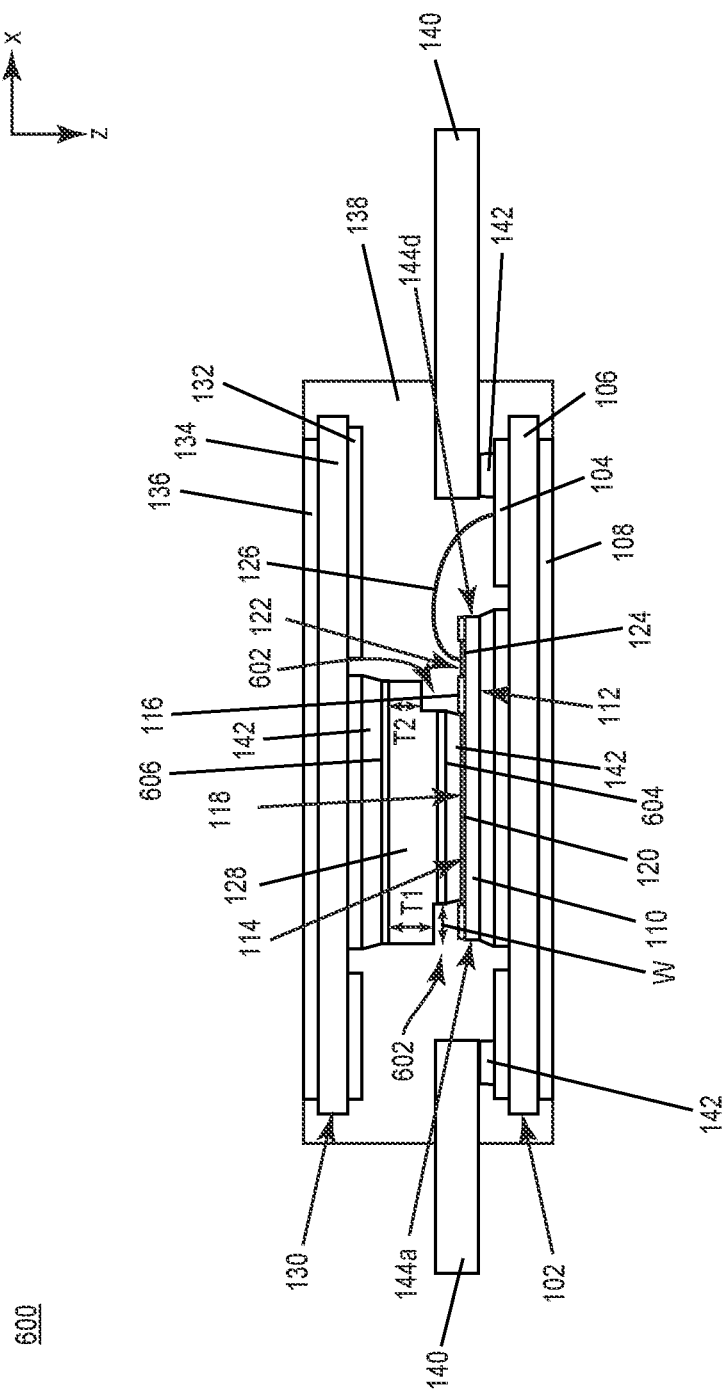
FIG. 6 illustrates a cross-sectional view of another embodiment of a semiconductor package having a spacer.

FIG. 6 illustrates a cross-sectional view of another embodiment of a semiconductor package 600. The embodiment shown in FIG. 6 is similar to the embodiments shown in FIGS. 1 through 5. In FIG. 6, the spacer has a step-cut 602 that at least partly overhangs the passivation 116 along at least one side face 144a, 144b, 144c, 144d of the semiconductor die 110 such that the spacer 128 is thinner in a region where the step-cut 602 at least partly overhangs the passivation 116.

The step-cut 602 may at least partly overhang the passivation 116 along each side face 114a, 144b, 144c, 144d of the semiconductor die 110 and may have a variable thickness such that the spacer 128 has a first thickness T1 along a first side face 144a of the semiconductor die 110 and a second thickness T2 along a different side face 144d of the die 110, where the first thickness T1 is greater than the second thickness T2. For example, the spacer 128 may be thinner (T2) along the side face 144d of the semiconductor die 110 over which the one or more wire bonds 126 extend so as to not interfere with the connection to the die gate pad 124.

A linear dimension 'W' of the step-cut 602 in a direction (x direction in FIG. 6) parallel with the second side 114 of the semiconductor die 110 may be variable. Accordingly, the amount by which the spacer 128 overhangs the passivation 116 may vary, e.g., along different side faces 144a, 144b, 144c, 144d of the semiconductor die 110.

The surface 604 of the spacer 128 that faces the semiconductor die 110 may be plated and the surface 606 of the spacer 128 that faces the second substrate 130 may be plated. The step-cut 602 may or may not be plated. In FIG. 6, the spacer step-cut 602 is not plated. In general, each sidewall of the spacer 128 may be partly plated, completely plated, or not plated.

Figure 7A:
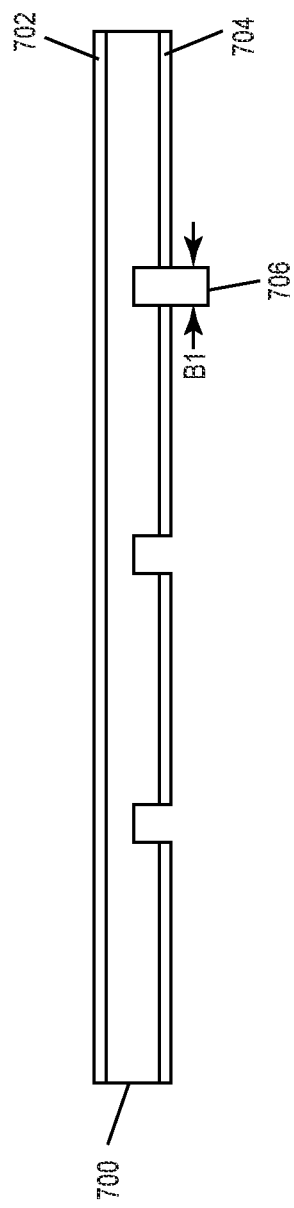
FIGS. 7A and 7B illustrate an embodiment of a method of producing the spacer with the step-cut shown in FIG. 6.
Figure 7B:
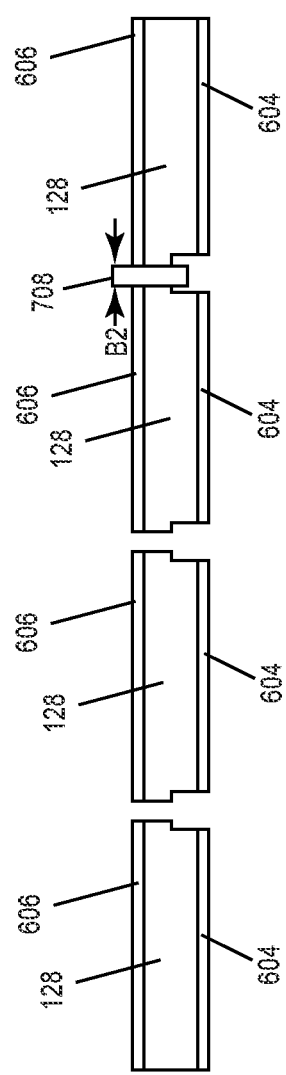

FIGS. 7A and 7B illustrate an embodiment of a method of producing the spacer 128 with the step-cut 602 shown in FIG. 6. In FIG. 7A, a spacer panel 700 with top and bottom metallized surfaces 702, 704 is partly singulated into individual spacers 128 by partly cutting the spacer panel 700 using a first saw blade or saw wire 706 having a first cutting width 'B1'. The spacer panel 700 may comprise, e.g., AlSiC. In FIG. 7B, the spacer singulation process is completed by completely cutting the spacer panel 700 using a second saw blade or saw wire 708 having a second cutting width 'B2' which is narrower than the first saw blade/wire 706. The difference in saw blade/wire widths B1-B2 determines the linear dimension W of the step-cut 602 shown in FIG. 6.

Figure 8:
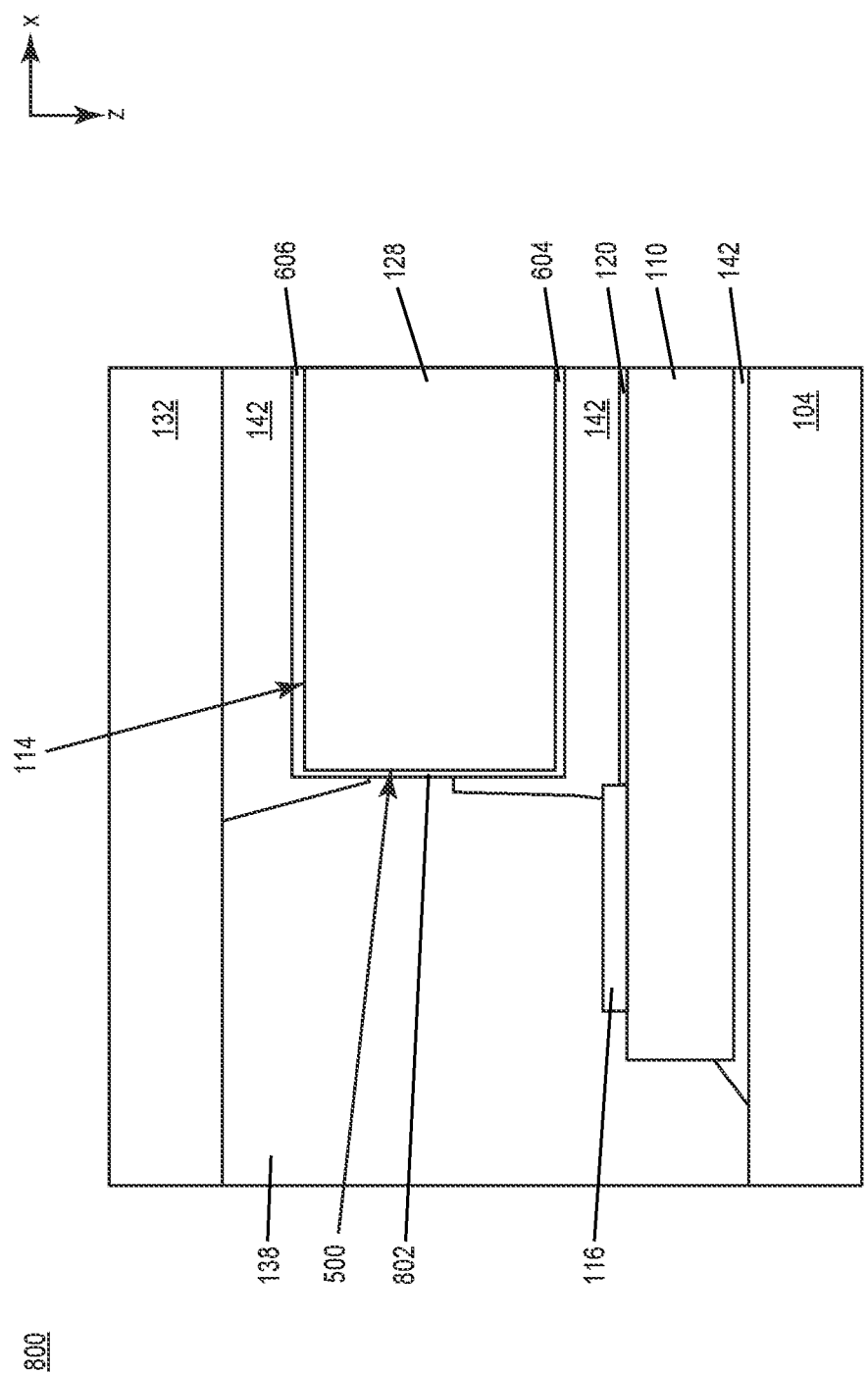
FIG. 8 illustrates a spacer embodiment where each sidewall of the spacer is at least partly plated to prevent solder extrusions from creating an electrical short by bridging die areas with different electrical potentials.

In some cases, the spacer 128 may be made of a material to which solder does not wet. In those cases, FIGS. 8 and 10 illustrate spacer embodiments where each sidewall 500 of the spacer 128 is at least partly plated. The spacer sidewall plating enables wetting of solder with the spacer 128, to prevent solder extrusions from creating an electrical short by bridging die areas with different electrical potentials. FIGS. 9A-9C and 11A-11C illustrate respective methods of production. The spacer embodiments illustrated FIGS. 8 and 10 may be used in conjunction with any of the semiconductor package embodiments illustrated in FIGS. 1 through 6.

FIG. 8 illustrates a partial cross-sectional view of another embodiment of a semiconductor package 800. The embodiment shown in FIG. 8 is similar to the embodiments shown in FIGS. 1 through 6. In FIG. 8, the spacer sidewalls 500 are fully plated 802 between the bottom and top plated surfaces 604, 606 of the spacer 128. The spacer sidewall plating enables wetting of solder with the spacer 128, to prevent solder extrusions from creating an electrical short by bridging die areas with different electrical potentials. The spacer sidewalls 500 may or may not be tapered, e.g., as previously described herein in connection with FIG. 5 and may or may not have a step-cut, e.g., as previously described herein in connection with FIG. 6.

Figure 9A:
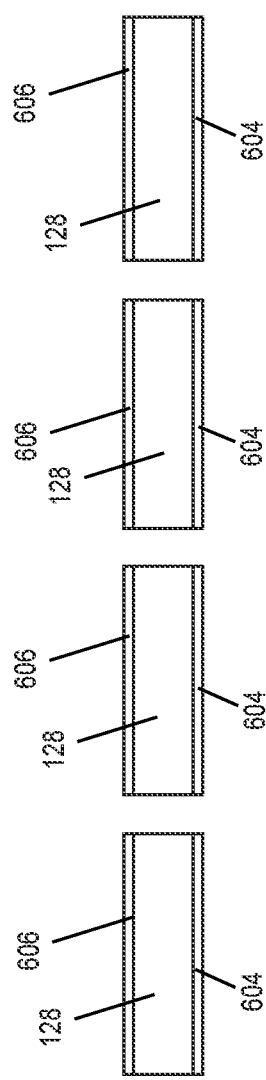
FIGS. 9A-9C illustrate an embodiment of a method of producing the spacer shown in FIG. 8.
Figure 9B:
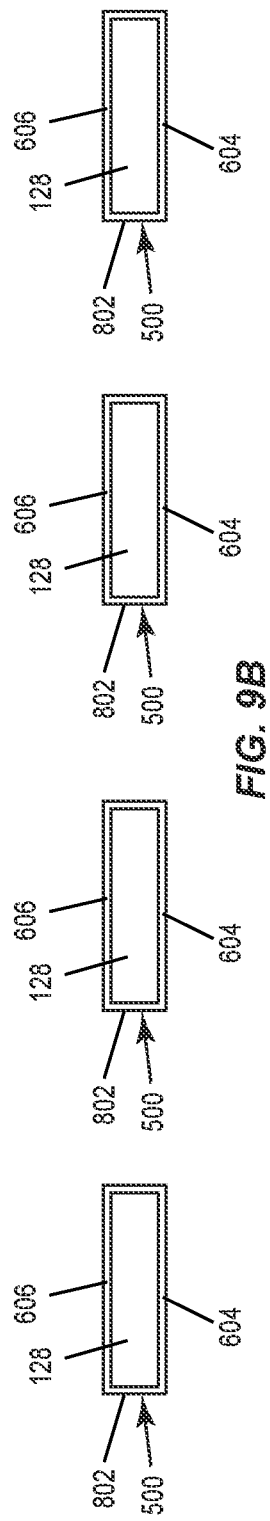
Figure 9C:
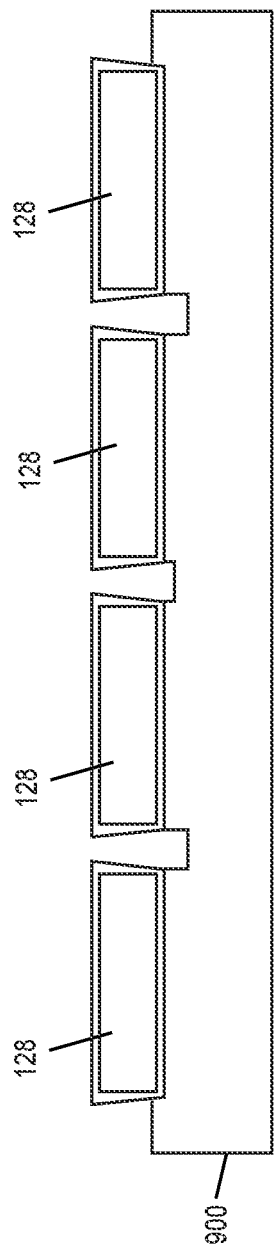
Figure 10:
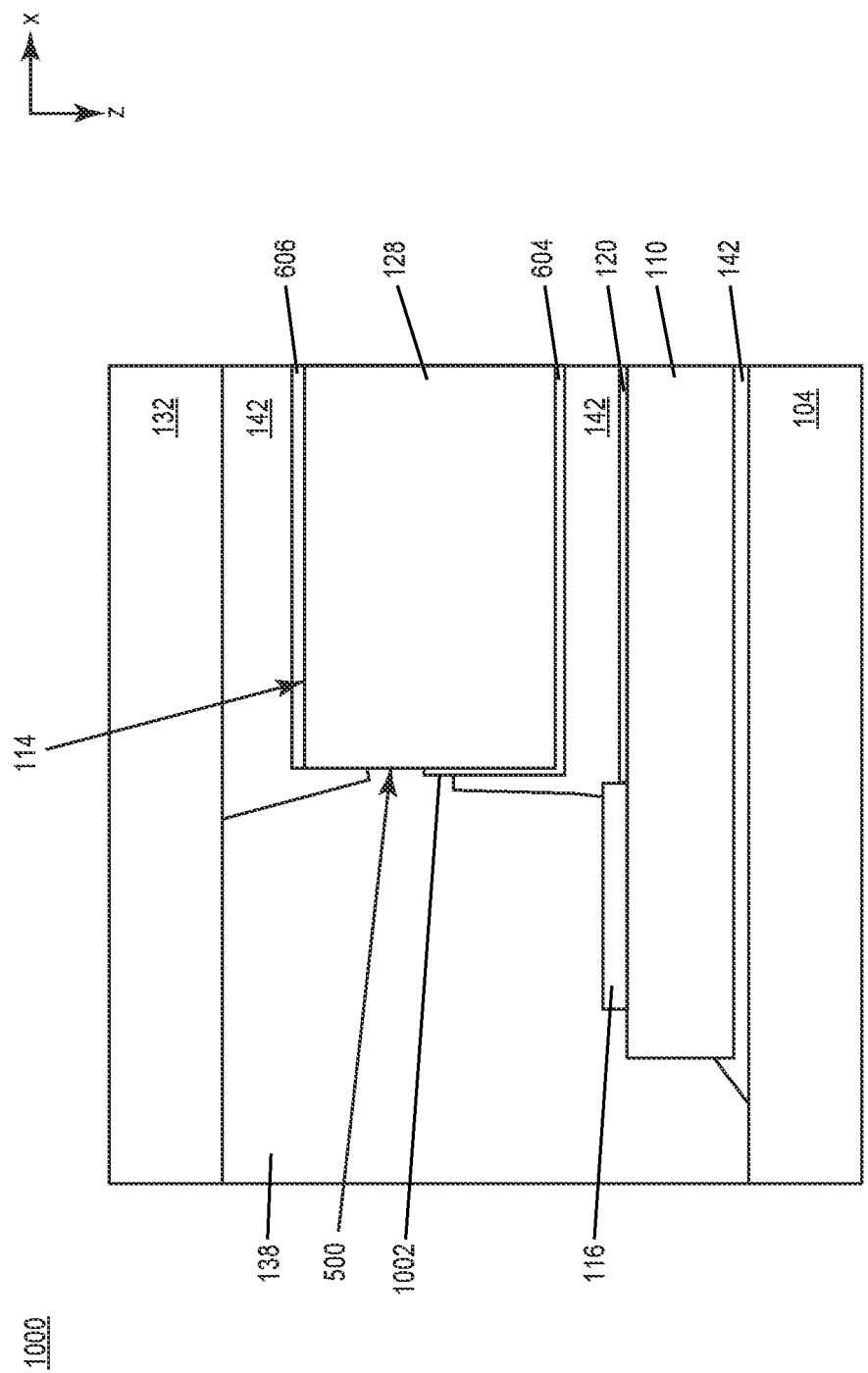
FIG. 10 illustrates another spacer embodiment where each sidewall of the spacer is at least partly plated to prevent solder extrusions from creating an electrical short by bridging die areas with different electrical potentials.

FIGS. 9A through 9C illustrate an embodiment of a method of producing the spacer 128 with the plated sidewalls 500/802 shown in FIG. 8. In FIG. 9A, a spacer panel has been singulated into individual spacers 128, e.g., as previously described herein in connection with FIGS. 7A-7B. In FIG. 9B, the spacer sidewalls 500 are metallized 802, e.g., by electroless plating or by an isotropic coating process such as sputtering after singulating the spacer panel into the individual spacers 128. In the case of an isotropic coating process, spacer order is maintained after sawing whereas electroless plating may be implemented using a bulk type plating process. Subsequent to the partial first cut process, all spacers 128 may still be electrically connected. Accordingly, standard plating processes may be applied. In addition, electroless plating or isotropic coating processes also may be used. Examples for the spacer sidewall metal coating 802 include: electroless Au (e.g., 0.005-0.1 μm), electroless Ni/Au (e.g., 4-6 μm/0.005-0.1 μm), electroless Ni/Pd/Au (e.g., 4-6 μm/0.005-0.1 μm/0.005-0.1 μm), electroless Sn (e.g., >0.8 μm), electroless Ag (e.g., 0.2-0.4 μm), plating Ni/Sn, plating Ni/Au. These combinations and other layer compositions may be coated by isotropic sputtering or other sidewall coating techniques. In FIG. 9C, an isotropic sidewall coating is applied with finite homogeneity and a complete cutting on a removable carrier 900 is performed.

FIG. 10 illustrates a partial cross-sectional view of another embodiment of a semiconductor package 1000. The embodiment shown in FIG. 10 is similar to the embodiment shown in FIG. 8. In FIG. 10, the spacer sidewalls 500 are plated 1002 in a region where the corresponding solder joint 142 extends onto the sidewalls 500 of the spacer 128. The spacer sidewall plating enables wetting of solder with the spacer 128, to prevent solder extrusions from creating an electrical short by bridging die areas with different electrical potentials. For example, at least a 0.5 mm region of the spacer sidewalls 500 above the upper die side 114 may be plated 1002. The spacer sidewalls 500 may or may not be tapered, e.g., as previously described herein in connection with FIG. 5 and may or may not have a step-cut, e.g., as previously described herein in connection with FIG. 6.

Figure 11A:
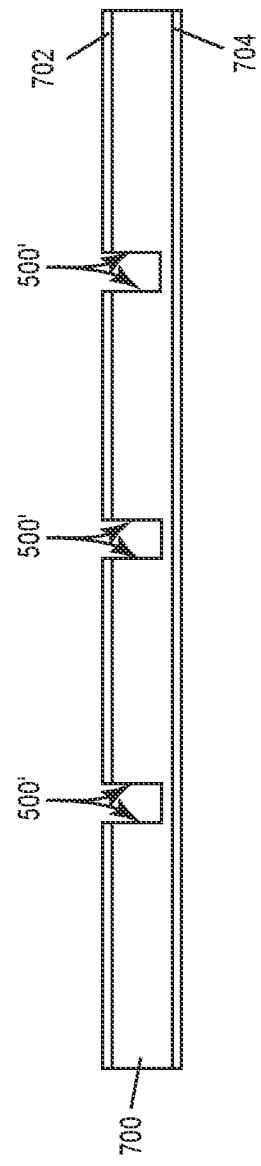
FIGS. 11A-11C illustrate an embodiment of a method of producing the spacer shown in FIG. 10.
Figure 11B:
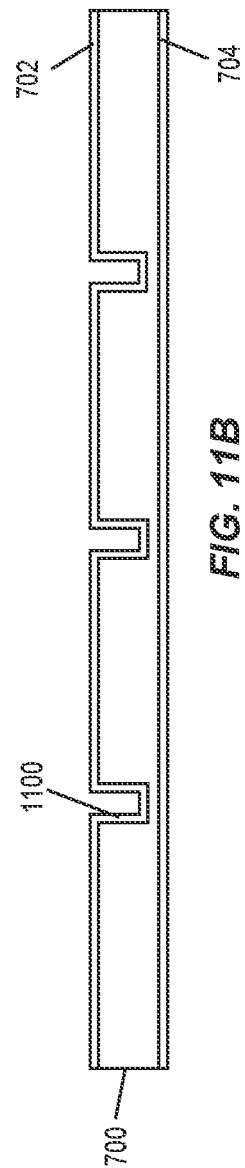
Figure 11C:
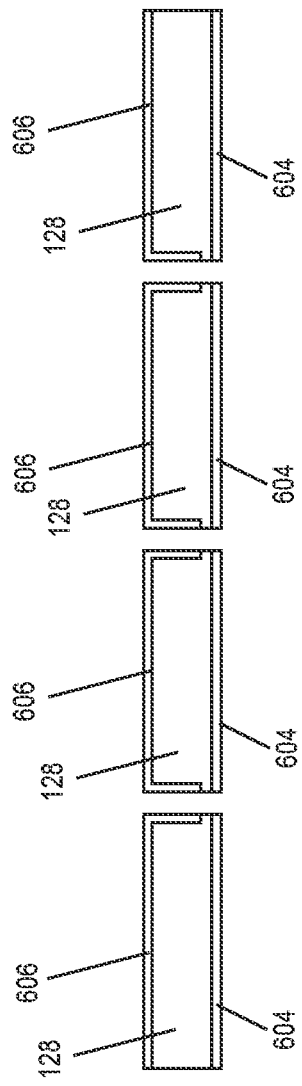

FIGS. 11A through 11O illustrate an embodiment of a method of producing the spacer 128 with the partly plated sidewalls 500/1002 shown in FIG. 10. In FIG. 11A, a spacer panel 700 is partly cut, e.g., as previously described herein in connection with FIG. 7A, to define a first part 500' of the spacer sidewalls 500. The partial cut may be in a range of 1 to 99% of the thickness of the spacer panel 700, e.g., in a range of 10 to 70% of the panel thickness. In FIG. 11B, the first part 500' of the spacer sidewalls 500 is metallized 1100 by electroless plating. In FIG. 11C, the spacer panel 700 is completely cut and thus singulated into individual spacers 128, e.g., as previously described herein in connection with FIG. 7B. The spacer sidewalls 500 may or may not be tapered, e.g., as previously described herein in connection with FIG. 5 and may or may not have a step-cut, e.g., as previously described herein in connection with FIG. 6.

Although the present disclosure is not so limited, the following numbered examples demonstrate one or more aspects of the disclosure.

Example 1. A semiconductor package, comprising: a first substrate having a first metallized side; a semiconductor die attached to the first metallized side of the first substrate at a first side of the semiconductor die, a second side of the semiconductor die opposite the first side being covered by a passivation, the passivation having a first opening that exposes at least part of a first pad at the second side of the semiconductor die; a thermally and electrically conductive spacer attached to the part of the first pad that is exposed by the first opening in the passivation, the spacer at least partly overhanging the passivation along at least one side face of the semiconductor die; a second substrate having a first metallized side attached to the spacer at an opposite side of the spacer as the semiconductor die; and an encapsulant encapsulating the semiconductor die and the spacer.

Example 2. The semiconductor package of example 1, wherein the semiconductor die is a power transistor die, wherein the first pad is a source or emitter pad, wherein the passivation has a second opening that exposes at least part of a gate pad at the second side of the semiconductor die, and wherein one or more wire bonds extend from the gate pad to the first metallized side of the first substrate.

Example 3. The semiconductor package of example 2, wherein the spacer at least partly overhangs the passivation along each side face of the semiconductor die except for a side face of the semiconductor die over which the one or more wire bonds extend.

Example 4. The semiconductor package of example 3, wherein the spacer overhangs each side face of the semiconductor die except for the side face over which the one or more wire bonds extend.

Example 5. The semiconductor package of any of example 2, wherein the spacer at least partly overhangs the passivation along each side face of the semiconductor die.

Example 6. The semiconductor package of any of examples 2 through 5, wherein the spacer has a step-cut that at least partly overhangs the passivation along the at least one side face of the semiconductor die such that the spacer is thinner in a region where the step-cut at least partly overhangs the passivation.

Example 7. The semiconductor package of example 6, wherein the step-cut at least partly overhangs the passivation along each side face of the semiconductor die and has a variable thickness such that the spacer has a first thickness along each side face of the semiconductor die except for a side face of the semiconductor die over which the one or more wire bonds extend and a second thickness along the side face over which the one or more wire bonds extend, and wherein the first thickness is greater than the second thickness.

Example 8. The semiconductor package of example 6 or 7, wherein a linear dimension of the step-cut in a direction parallel with the second side of the semiconductor die is variable.

Example 9. The semiconductor package of any of examples 6 through 8, wherein a first surface of the spacer that faces the semiconductor die is plated, wherein a second surface of the spacer that faces the second substrate is plated, and wherein the step-cut is not plated.

Example 10. The semiconductor package of any of examples 6 through 8, wherein a first surface of the spacer that faces the semiconductor die is plated, wherein a second surface of the spacer that faces the second substrate is plated, and wherein the step-cut is plated.

Example 11. The semiconductor package of any of examples 2 through 10, wherein the power transistor die is a vertical power transistor die, and wherein the first side of the vertical power transistor die includes a drain or collector terminal attached to the first metallized side of the first substrate.

Example 12. The semiconductor package of any of examples 1 through 11, wherein the spacer overhangs the at least one side face of the semiconductor die.

Example 13. The semiconductor package of any of examples 1 through 12, wherein the semiconductor die has four side faces, and wherein the spacer at least partly overhangs the passivation along three of the four side faces of the semiconductor die.

Example 14. The semiconductor package of example 13, wherein the spacer overhangs the three of the four side faces of the semiconductor die.

Example 15. The semiconductor package of any of examples 1 through 14, wherein the spacer at least partly overhangs the passivation along each side face of the semiconductor die.

Example 16. The semiconductor package of any of examples 1 through 15, wherein the spacer has sidewalls that taper in a direction of the semiconductor die.

Example 17. The semiconductor package of any of examples 1 through 16, wherein the spacer has a step-cut that at least partly overhangs the passivation along the at least one side face of the semiconductor die such that the spacer is thinner in a region where the step-cut at least partly overhangs the passivation.

Example 18. The semiconductor package of example 17, wherein the step-cut at least partly overhangs the passivation along each side face of the semiconductor die and has a variable thickness such that the spacer has a first thickness along a first one of the side faces of the semiconductor die and a second thickness along a second one of the side faces, and wherein the first thickness is greater than the second thickness.

Example 19. The semiconductor package of example 17 or 18, wherein a linear dimension of the step-cut in a direction parallel with the second side of the semiconductor die is variable.

Example 20. The semiconductor package of any of examples 17 through 19, wherein a first surface of the spacer that faces the semiconductor die is plated, wherein a second surface of the spacer that faces the second substrate is plated, and wherein the step-cut is not plated.

Example 21. The semiconductor package of any of examples 17 through 19, wherein a first surface of the spacer that faces the semiconductor die is plated, wherein a second surface of the spacer that faces the second substrate is plated, and wherein the step-cut is plated.

Example 22. The semiconductor package of any of examples 1 through 21, wherein the first metallized side of the second substrate is contiguous and devoid of solder stop holes.

Example 23. The semiconductor package of any of examples 1 through 22, wherein the spacer has a plurality of sidewalls, and wherein each sidewall of the spacer is at least partly plated.

Example 24. A semiconductor package, comprising: a first substrate having a first metallized side; a solder joint between the first metallized side of the first substrate and a semiconductor die at a first side of the semiconductor die, a second side of the semiconductor die opposite the first side being covered by a passivation, the passivation having an opening that exposes at least part of a pad at the second side of the semiconductor die; a thermally and electrically conductive spacer attached to the part of the pad that is exposed by the opening in the passivation, the spacer having a plurality of sidewalls each of which is plated at least in a region where the solder joint extends onto the sidewalls of the spacer; a second substrate having a first metallized side attached to the spacer at an opposite side of the spacer as the semiconductor die; and an encapsulant encapsulating the semiconductor die and the spacer.

Example 25. A method of producing a semiconductor package, the method comprising: attaching a semiconductor die to a first metallized side of a first substrate at a first side of the semiconductor die, a second side of the semiconductor die opposite the first side being covered by a passivation, the passivation having a first opening that exposes at least part of a first pad at the second side of the semiconductor die; attaching a thermally and electrically conductive spacer to the part of the first pad that is exposed by the first opening in the passivation, the spacer at least partly overhanging the passivation along at least one side face of the semiconductor die; attaching a first metallized side of a second substrate to the spacer at an opposite side of the spacer as the semiconductor die; and encapsulating the semiconductor die and the spacer in an encapsulant.

Example 26. The method of example 25, further comprising: plating, at least partially, each sidewall of the spacer before attaching the spacer to the part of the first pad that is exposed by the first opening in the passivation.

Example 27. The method of example 26, further comprising: producing the spacer from a spacer panel by singulating the spacer panel into individual spacers.

Example 28. The method of example 27, wherein plating, at least partially, each sidewall of the spacer comprises: plating each sidewall of the individual spacers after singulating the spacer panel into the individual spacers.

Example 29. The method of example 27, wherein plating, at least partially, each sidewall of the spacer comprises: partly cutting the spacer panel to define a first part of the sidewalls of the individual spacers; and before completely cutting through the spacer panel to singulate the spacer panel into the individual spacers, plating the first part of the sidewalls.

Example 30. A method of producing a semiconductor package, the method comprising: forming a solder joint between a first metallized side of a first substrate and a semiconductor die at a first side of the semiconductor die, a second side of the semiconductor die opposite the first side being covered by a passivation, the passivation having an opening that exposes at least part of a pad at the second side of the semiconductor die; attaching a thermally and electrically conductive spacer to the part of the pad that is exposed by the opening in the passivation, the spacer having a plurality of sidewalls each of which is plated at least in a region where the solder joint extends onto the sidewalls of the spacer; attaching a first metallized side of a second substrate to the spacer at an opposite side of the spacer as the semiconductor die; and encapsulating the semiconductor die and the spacer in an encapsulant.

Example 31. The method of example 30, further comprising: plating, at least partially, each sidewall of the spacer before attaching the spacer to the part of the first pad that is exposed by the first opening in the passivation.

Example 32. The method of example 31, further comprising: producing the spacer from a spacer panel by singulating the spacer panel into individual spacers.

Example 33. The method of example 32, wherein plating, at least partially, each sidewall of the spacer comprises: plating each sidewall of the individual spacers after singulating the spacer panel into the individual spacers.

Example 34. The method of example 32, wherein plating, at least partially, each sidewall of the spacer comprises: partly cutting the spacer panel to define a first part of the sidewalls of the individual spacers; and before completely cutting through the spacer panel to singulate the spacer panel into the individual spacers, plating the first part of the sidewalls.

Example 35. A method of producing a plurality of individual thermally and electrically conductive spacers for use in semiconductor packages, the method comprising: singulating a spacer panel into the plurality of individual thermally and electrically conductive spacers; and plating, at least partially, each sidewall of the individual spacers before, within or after singulating the spacer panel.

Example 36. The method of example 35, wherein plating, at least partially, each sidewall of the individual spacers comprises: plating each sidewall of the individual spacers after singulating the spacer panel into the individual spacers.

Example 37. The method of example 35, wherein plating, at least partially, each sidewall of the individual spacers comprises: partly cutting the spacer panel to define a first part of the sidewalls of the individual spacers; and before completely cutting through the spacer panel to singulate the spacer panel into the individual spacers, plating the first part of the sidewalls.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a first substrate having a first metallized side;
a semiconductor die attached to the first metallized side of the first substrate at a first side of the semiconductor die, a second side of the semiconductor die opposite the first side being covered by a passivation, the passivation having a first opening that exposes at least part of a first pad at the second side of the semiconductor die;
a thermally and electrically conductive spacer attached to the part of the first pad that is exposed by the first opening in the passivation, the spacer at least partly overhanging the passivation along at least one side face of the semiconductor die;
a second substrate having a first metallized side attached to the spacer at an opposite side of the spacer as the semiconductor die; and
an encapsulant encapsulating the semiconductor die and the spacer.

2. The semiconductor package of claim 1, wherein the semiconductor die is a power transistor die, wherein the first pad is a source or emitter pad, wherein the passivation has a second opening that exposes at least part of a gate pad at the second side of the semiconductor die, and wherein one or more wire bonds extend from the gate pad to the first metallized side of the first substrate.

3. The semiconductor package of claim 2, wherein the spacer at least partly overhangs the passivation along each side face of the semiconductor die except for a side face of the semiconductor die over which the one or more wire bonds extend.

4. The semiconductor package of claim 3, wherein the spacer overhangs each side face of the semiconductor die except for the side face over which the one or more wire bonds extend.

5. The semiconductor package of claim 2, wherein the spacer at least partly overhangs the passivation along each side face of the semiconductor die.

6. The semiconductor package of claim 2, wherein the spacer has a step-cut that at least partly overhangs the passivation along the at least one side face of the semiconductor die such that the spacer is thinner in a region where the step-cut at least partly overhangs the passivation.

7. The semiconductor package of claim 6, wherein the step-cut at least partly overhangs the passivation along each side face of the semiconductor die and has a variable thickness such that the spacer has a first thickness along each side face of the semiconductor die except for a side face of the semiconductor die over which the one or more wire bonds extend and a second thickness along the side face over which the one or more wire bonds extend, and wherein the first thickness is greater than the second thickness.

8. The semiconductor package of claim 6, wherein a linear dimension of the step-cut in a direction parallel with the second side of the semiconductor die is variable.

9. The semiconductor package of claim 6, wherein a first surface of the spacer that faces the semiconductor die is plated, wherein a second surface of the spacer that faces the second substrate is plated, and wherein the step-cut is not plated.

10. The semiconductor package of claim 6, wherein a first surface of the spacer that faces the semiconductor die is plated, wherein a second surface of the spacer that faces the second substrate is plated, and wherein the step-cut is plated.

11. The semiconductor package of claim 2, wherein the power transistor die is a vertical power transistor die, and wherein the first side of the vertical power transistor die includes a drain or collector terminal attached to the first metallized side of the first substrate.

12. The semiconductor package of claim 1, wherein the spacer overhangs the at least one side face of the semiconductor die.

13. The semiconductor package of claim 1, wherein the semiconductor die has four side faces, and wherein the spacer at least partly overhangs the passivation along three of the four side faces of the semiconductor die.

14. The semiconductor package of claim 13, wherein the spacer overhangs the three of the four side faces of the semiconductor die.

15. The semiconductor package of claim 1, wherein the spacer at least partly overhangs the passivation along each side face of the semiconductor die.

16. The semiconductor package of claim 1, wherein the spacer has sidewalls that taper in a direction of the semiconductor die.

17. The semiconductor package of claim 1, wherein the spacer has a step-cut that at least partly overhangs the passivation along the at least one side face of the semiconductor die such that the spacer is thinner in a region where the step-cut at least partly overhangs the passivation.

18. The semiconductor package of claim 17, wherein the step-cut at least partly overhangs the passivation along each side face of the semiconductor die and has a variable thickness such that the spacer has a first thickness along a first one of the side faces of the semiconductor die and a second thickness along a second one of the side faces, and wherein the first thickness is greater than the second thickness.

19. The semiconductor package of claim 17, wherein a linear dimension of the step-cut in a direction parallel with the second side of the semiconductor die is variable.

20. The semiconductor package of claim 17, wherein a first surface of the spacer that faces the semiconductor die is plated, wherein a second surface of the spacer that faces the second substrate is plated, and wherein the step-cut is not plated.

21. The semiconductor package of claim 17, wherein a first surface of the spacer that faces the semiconductor die is plated, wherein a second surface of the spacer that faces the second substrate is plated, and wherein the step-cut is plated.

22. The semiconductor package of claim 1, wherein the first metallized side of the second substrate is contiguous and devoid of solder stop holes.

23. The semiconductor package of claim 1, wherein the spacer has a plurality of sidewalls, and wherein each sidewall of the spacer is at least partly plated.

24. A semiconductor package, comprising:
a first substrate having a first metallized side;
a first solder joint between the first metallized side of the first substrate and a semiconductor die at a first side of the semiconductor die, a second side of the semiconductor die opposite the first side being covered by a passivation, the passivation having an opening that exposes at least part of a pad at the second side of the semiconductor die;
a second solder joint between a thermally and electrically conductive spacer and the part of the pad that is exposed by the opening in the passivation, the spacer having a plurality of sidewalls each of which is plated at least in a region where the second solder joint extends onto the sidewalls of the spacer;
a second substrate having a first metallized side attached to the spacer at an opposite side of the spacer as the semiconductor die; and
an encapsulant encapsulating the semiconductor die and the spacer.

25. The semiconductor package of claim 1, further comprising a gap between the passivation and a portion of the spacer that overhangs the passivation, wherein the gap limits a volume of the encapsulant between the passivation and the portion of the spacer that overhangs the passivation.

* * * * *